United States Patent
Ohtsu

(10) Patent No.: US 10,248,026 B2
(45) Date of Patent: Apr. 2, 2019

(54) METHOD FOR ETCHING PROTECTIVE FILM, METHOD FOR PRODUCING TEMPLATE, AND TEMPLATE PRODUCED THEREBY

(71) Applicant: FUJIFILM Corporation, Tokyo (JP)

(72) Inventor: Akihiko Ohtsu, Shizuoka-ken (JP)

(73) Assignee: FUJIFILM Corporation, Minato-Ku, Tokyo (JP)

( * ) Notice: Subject to any disclaimer, the term of this patent is extended or adjusted under 35 U.S.C. 154(b) by 575 days.

(21) Appl. No.: 14/863,693

(22) Filed: Sep. 24, 2015

(65) Prior Publication Data

US 2016/0018738 A1 Jan. 21, 2016

Related U.S. Application Data

(63) Continuation of application No. PCT/JP2014/001827, filed on Mar. 28, 2014.

(30) Foreign Application Priority Data

Mar. 29, 2013 (JP) .................... 2013-071643

(51) Int. Cl.
*G03F 7/40* (2006.01)
*H01J 37/32* (2006.01)
(Continued)

(52) U.S. Cl.
CPC ............ *G03F 7/40* (2013.01); *B29C 33/3842* (2013.01); *G03F 7/0002* (2013.01);
(Continued)

(58) Field of Classification Search
CPC ............ B29C 33/3842; H01J 37/32942; H01J 2237/3341; H01J 2237/334; G03F 7/0002; G03F 7/40
See application file for complete search history.

(56) References Cited

U.S. PATENT DOCUMENTS 5,221,427 A * 6/1993 Koinuma ................ B29C 59/14
156/345.46
5,686,050 A * 11/1997 Wadsworth ........ B01D 39/1615
204/164

(Continued)

FOREIGN PATENT DOCUMENTS

JP 2-45912 A 2/1990
JP 5-295552 A 11/1993
(Continued)

OTHER PUBLICATIONS

Machine translation of JP2006-131954A (Year: 2018).*

(Continued)

*Primary Examiner* — Yogendra N Gupta
*Assistant Examiner* — Emmanuel S Luk
(74) *Attorney, Agent, or Firm* — Sughrue Mion, PLLC

(57) ABSTRACT

A substrate having a protective film formed on a front surface and a recess in a back surface opposite the front surface is prepared. A resist pattern is formed on the protective film. The protective film is etched using plasma while applying a bias voltage, using the resist pattern as a mask. The bias voltage is increased according to the manner of decrease in the dielectric constant of a region of the substrate corresponding to a covered region of the front surface at which the protective film is present.

9 Claims, 6 Drawing Sheets

(51) Int. Cl.
*B29C 33/38* (2006.01)
*G03F 7/00* (2006.01)

(52) U.S. Cl.
CPC ... *H01J 37/32972* (2013.01); *H01J 2237/334* (2013.01); *H01J 2237/3341* (2013.01)

(56) References Cited

U.S. PATENT DOCUMENTS

| | | | | |
|---|---|---|---|---|
| 6,315,543 | B1* | 11/2001 | Lausenhammer | B29C 45/42 264/334 |
| 6,942,892 | B1* | 9/2005 | Ishibashi | C23C 16/44 118/723 HC |
| 7,698,395 | B2* | 4/2010 | Hall | H04L 12/422 370/230 |
| 7,758,761 | B2* | 7/2010 | Nakagawa | G02B 6/136 216/58 |
| 9,373,521 | B2* | 6/2016 | Mochiki | H01J 37/32091 |
| 9,401,263 | B2* | 7/2016 | Hu | H01J 37/32146 |
| 2001/0030169 | A1* | 10/2001 | Kitagawa | H01L 21/31138 216/17 |
| 2002/0069971 | A1* | 6/2002 | Kaji | H01J 37/32082 156/345.46 |
| 2003/0181067 | A1* | 9/2003 | Yamaoka | H01L 21/0332 438/780 |
| 2004/0155342 | A1* | 8/2004 | Usami | H01L 21/76801 257/751 |
| 2005/0042881 | A1* | 2/2005 | Nishimoto | H01L 21/67248 438/710 |
| 2005/0048787 | A1* | 3/2005 | Negishi | H01L 21/0275 438/706 |
| 2005/0103441 | A1* | 5/2005 | Honda | H01J 37/32082 156/345.47 |
| 2005/0284571 | A1* | 12/2005 | Negishi | C23F 4/00 156/345.28 |
| 2006/0121153 | A1* | 6/2006 | Neter | B29C 45/42 425/556 |
| 2008/0020570 | A1* | 1/2008 | Naik | H01L 21/31116 438/675 |
| 2008/0020585 | A1* | 1/2008 | Shimizu | H01L 21/31116 438/725 |
| 2008/0110859 | A1* | 5/2008 | Koshiishi | H01J 37/32027 216/67 |
| 2008/0217822 | A1* | 9/2008 | Chou | B29C 43/003 264/496 |
| 2009/0078678 | A1* | 3/2009 | Kojima | H01J 37/32091 216/71 |
| 2010/0243606 | A1* | 9/2010 | Koshimizu | H01J 37/32091 216/67 |
| 2011/0037068 | A1* | 2/2011 | Yamazaki | H01L 27/1225 257/43 |
| 2011/0086517 | A1* | 4/2011 | Honda | H01L 21/0217 438/792 |
| 2012/0222700 | A1 | 9/2012 | Ota | |
| 2014/0302682 | A1* | 10/2014 | Muto | H01L 21/3065 438/711 |
| 2015/0000841 | A1* | 1/2015 | Yamada | H01J 37/32183 156/345.28 |
| 2015/0021161 | A1* | 1/2015 | Johnson | B01J 19/088 204/157.15 |
| 2015/0022790 | A1* | 1/2015 | Johnson | B05C 9/12 355/27 |
| 2016/0379800 | A1* | 12/2016 | Ohtsu | G03F 7/0002 216/13 |
| 2017/0133206 | A1* | 5/2017 | Tahara | H01J 37/321 |
| 2017/0186589 | A1* | 6/2017 | Sato | H01J 37/32577 |
| 2017/0207110 | A1* | 7/2017 | Satoh | H01L 21/6833 |

FOREIGN PATENT DOCUMENTS

| | | |
|---|---|---|
| JP | 2005-128218 A | 5/2005 |
| JP | 2006-131954 A | 5/2006 |
| JP | 2007-193037 A | 8/2007 |
| JP | 2012-182384 A | 9/2012 |

OTHER PUBLICATIONS

Machine translation of JP2012-182384A (Year: 2018).*
Communication dated Dec. 26, 2017 from the Korean Intellectual Property Office in counterpart Application No. 10-2015-7030371.
Communication dated Jun. 20, 2017 from the Korean Intellectual Property Office in counterpart application No. 10-2015-7030371.
International Search Report for PCT/JP2014/001827 dated Aug. 5, 0214 [PCT/ISA/210].
Written Opinion for PCT/JP2014/001827 dated Aug. 5, 2014 [PCT/ISA/237].

* cited by examiner

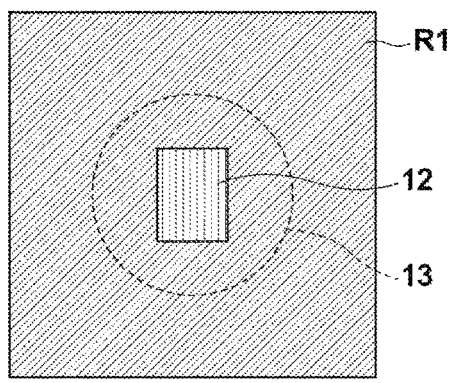
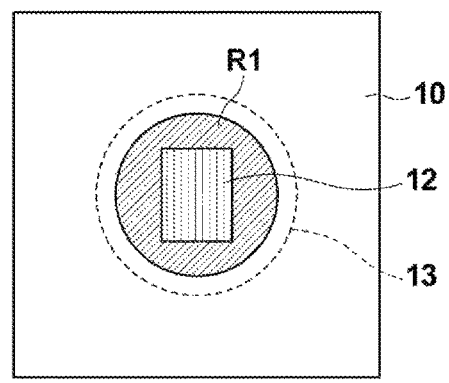
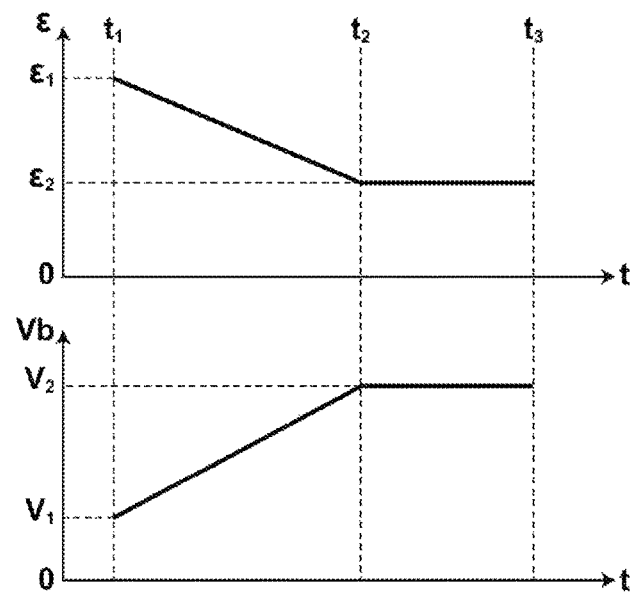

METHOD FOR ETCHING PROTECTIVE FILM, METHOD FOR PRODUCING TEMPLATE, AND TEMPLATE PRODUCED THEREBY

CROSS REFERENCE TO RELATED APPLICATIONS

The present application is a Continuation of PCT International Application No. PCT/JP2014/001827, filed on Mar. 28, 2014, which claims priority under 35 U.S.C. § 119(a) to Japanese Patent Application No. 2013-071643 filed on Mar. 29, 2013. Each of the above applications is hereby expressly incorporated by reference, in its entirety, into the present application.

BACKGROUND

The present disclosure is related to a method for etching a protective film formed on a substrate using plasma. The present disclosure is also related to a method for producing a template that utilizes the protective film etching method and to a template which is produced by the method for producing a template.

In recent years, films having patterns of protrusions and recesses of photo masks for exposure and hard masks for etching, for example, are often produced by etching protective films formed by materials such as chromium or chromium oxide provided on substrates using plasma, accompanying decreases in processing dimensions.

The intensity of bias voltages in etching processes varies depending on the states of etching apparatuses during etching. Therefore, Japanese Unexamined Patent Publication No. 2007-193037, for example, discloses suppressing changes in a bias voltage in an etching process based on an aperture ratio of a pattern to be formed in the surface of a substrate and a predicted value of changes in reactance.

SUMMARY

However, in the method of Japanese Unexamined Patent Publication No. 2007-193037, there is a problem that changes in bias voltage cannot be appropriately suppressed with respect to etching of substrates having recesses on surfaces opposite surfaces which are to be utilized in the manufacture of nanoimprinting templates.

Specifically, when etching a substrate having a recess in the back surface thereof, the surface electrical potential differs at the region where the recess is present and at regions where the recess is not present. That is, when a template is produced using a substrate having a recess in the back surface thereof, in the production of templates that often involve forming patterns of protrusions and recesses in localized regions, changes in bias voltage at these local regions cannot be predicted appropriately if the average reactance of the entire substrate is considered as in Japanese Unexamined Patent Publication No. 2007-193037 (paragraph 21 of Japanese Unexamined Patent Publication No. 2007-193037).

The present disclosure has been developed in view of the above circumstances. The present disclosure provides a method for etching a protective film that enables the formation of high quality patterns of protrusions and recesses on protective films formed on substrates having recesses on the back surfaces thereof, and a method for producing a template.

Further, the present disclosure provides a method for producing a template that utilizes the above etching method and a template which is produced by the method for producing a template.

A method for etching a protective film of the present disclosure comprises:

preparing a substrate having a protective film formed on a front surface and a recess in a back surface opposite the front surface;

forming a resist pattern on the protective film; and etching the protective film using plasma while applying a bias voltage, using the resist pattern as a mask;

the bias voltage being increased according to the manner of decrease in the dielectric constant of a region of the substrate corresponding to a covered region of the front surface at which the protective film is present.

In the method for etching a protective film of the present disclosure, a configuration may be adopted wherein the bias voltage is increased according to a degree of decrease in the dielectric constant while the dielectric constant is decreasing, and maintained at a value corresponding to a constant value while the dielectric constant is at the constant value. Alternatively, a configuration may be adopted, wherein the bias voltage is zero while the dielectric constant is decreasing, then increased to a value corresponding to a constant value while the dielectric constant is at the constant value.

In addition, in the method for etching a protective film of the present disclosure, the range of the covered region may be detected during etching, and the manner of decrease in the dielectric constant may be determined based on the manner of change in the percentage of the recess within the region of the substrate corresponding to the covered region.

In addition, in the method for etching a protective film of the present disclosure, plasma components may be measured by plasma emission spectroscopy during etching, and the manner of decrease of the dielectric constant may be determined based on the manner of change in the amount of a component which is correlated with etching of the protective film from among the measured components.

In addition, in the method for etching a protective film of the present disclosure, the manner of increase of the bias voltage may be determined in advance based on the relationship between etching time and the manner of decrease of the dielectric constant during etching, and the bias voltage may be increased according to the determined manner of increase of the bias voltage.

In addition, in the method for etching a protective film of the present disclosure, it is preferable for the percentage of metal materials within the constituent material of the protective film to be 40% or greater.

In addition, in the method for etching a protective film of the present disclosure, it is preferable for the transmittance of the protective film with respect to light having a wavelength of 365 nm to be 30% or greater.

A method for producing a template of the present disclosure comprises:

etching a protective film formed on a substrate having a recess on the back surface thereof by the method for etching a protective film described above; and etching the substrate using the etched protective film as a mask.

A template of the present disclosure is characterized by being produced by the method for producing a template described above.

The method for etching a protective film of the present disclosure increases the bias voltage according to the manner of decrease in the dielectric constant of a region of the substrate corresponding to a covered region of the surface of the substrate at which the protective film is present. Therefore, changes in bias voltage at local regions of the surface of the substrate at which patterns of protrusions and recesses are formed can be predicted appropriately and corrected for. As a result, it becomes possible to form a high quality pattern of protrusions and recesses on a protective film formed on a substrate having a recess on the back surface thereof.

In addition, the method for producing a template of the present disclosure utilizes the above method for etching a protective film. Therefore, it becomes possible to form a high quality pattern of protrusions and recesses on a protective film formed on a substrate having a recess on the back surface thereof.

In addition, the template of the present disclosure is produced by the above method for producing a template. Therefore, the template has a high quality pattern of protrusions and recesses.

BRIEF DESCRIPTION OF THE DRAWINGS

FIG. 2A is a schematic plan view showing a state before reduction of a protective film during an etching process.

FIG. 2B is a schematic plan view showing a state after reduction of the protective film during the etching process.

FIG. 3 is a graph showing the manner of decrease of a dielectric constant and the manner of increase of a bias voltage in the first embodiment.

DETAILED DESCRIPTION OF THE PREFERRED EMBODIMENTS

Figure 1:
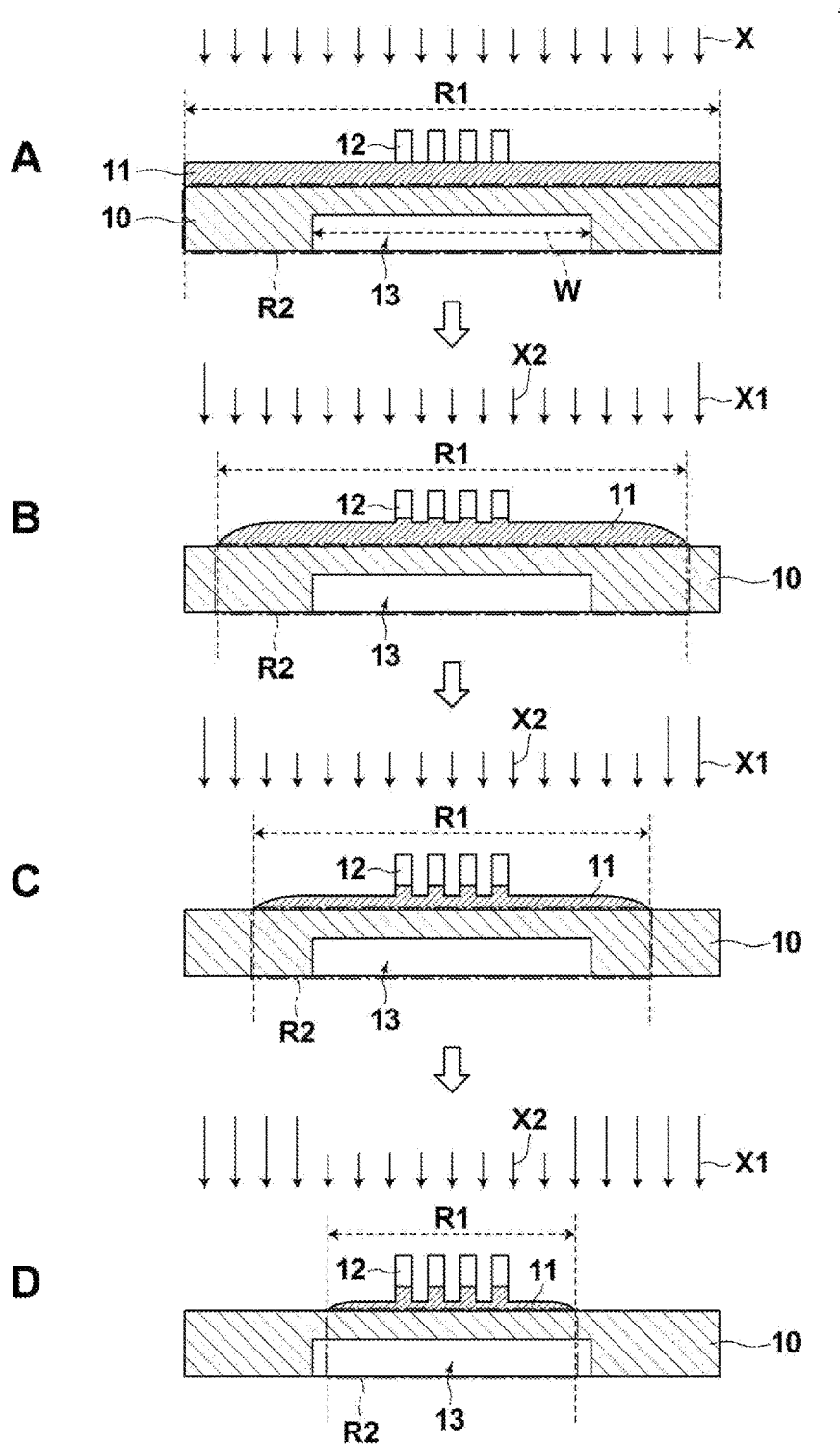
FIG. 1 is a collection of schematic cross sectional diagrams showing the steps of a method for etching a protective film according to a first embodiment.

Hereinafter, embodiments of the present disclosure will be described with reference to the attached drawings. However, the present invention is not limited to the embodiments to be described below. Note that in the drawings, the dimensions of the constitutive elements are drawn differently from the actual dimensions thereof, in order to facilitate visual recognition thereof.

"Problems of Conventional Technology"

Before describing the embodiments of the present disclosure, challenges in etching a substrate having a recess on the back surface thereof will be described. A of FIG. 6 is a schematic view showing a state of plasma etching, and B of FIG. 6 is a conceptual diagram of an equivalent circuit during plasma etching in which a substrate is considered as a capacitor.

Figure 6:
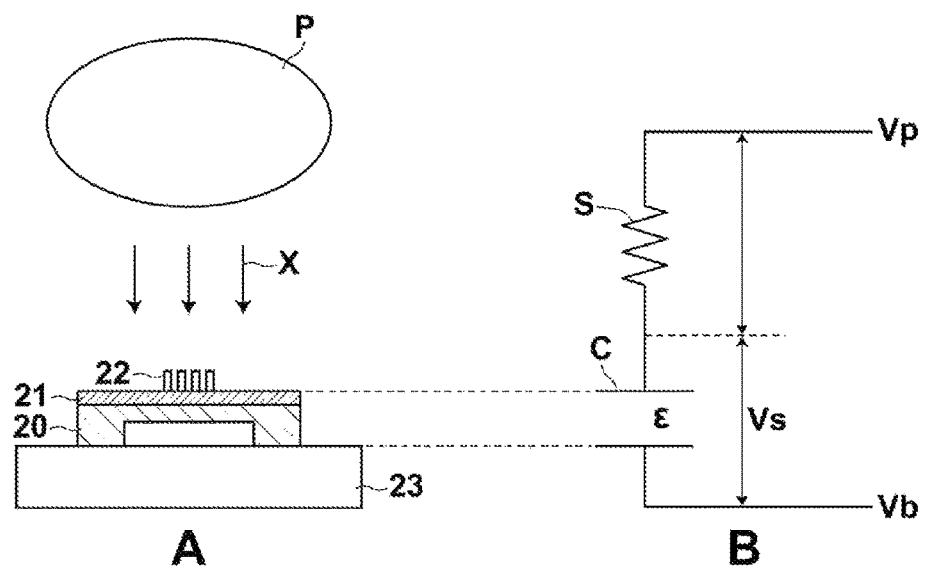
FIG. 6 is a collection of schematic diagrams, wherein A illustrates a state of plasma etching, and B is a conceptual diagram of an equivalent circuit at the time of plasma etching when a substrate is considered as a capacitor.

Generally, when forming a pattern on a protective film 21 which is formed on the substrate 20 as a hard mask as shown in FIG. 6, an etching method (reactive ion etching), in which a resist pattern 22 is formed on the protective film 21, the substrate is placed on the lower electrode 23 of an etching container, and plasma P is employed to etch the protective film 21 using the resist pattern 22 as a mask, is applied. A metal material such as chromium (Cr), tantalum (Ta), and molybdenum silicide ($MoSi_2$), a semiconductor, or compounds thereof is often used as the material of the protective film 21. At this time, the protective film 21 is a conductor (or a semiconductor), and the substrate 20 is a dielectric. Therefore, the substrate 20 and the protective film 21 may be considered to be a capacitor C with equal electric potential formed on each of the front surface and the back surface of the substrate. The dielectric constant $\varepsilon$ of the capacitor C is determined by the material of the substrate.

When a negative voltage is applied to the substrate 20 (a bias voltage Vb), positive ions X are drawn to the substrate 20 through an ion sheath S based on the potential difference between the surface electrical potential Vs and the plasma potential Vp generated in the surface of the substrate 20 and enter the protective film 21. The plasma potential is determined by the generation conditions of the plasma. Therefore, if plasma generation conditions during the etching remain unchanged, the kinetic energy of the positive ions X will become smaller as larger the surface electrical potential Vs becomes greater. However, in the case that a conventional flat substrate 20 is employed, since the surface electrical potential does not change, the kinetic energy of the positive ions X usually does not change over time. In addition, the kinetic energy of the positive ions X that enter the protective film 21 will be constant, since the surface of the protective film 21 having the properties of a conductor or a semiconductor is equipotential, and does not depend on the location. For the sake of simplicity, in B of FIG. 6, the ion sheath is represented as a resistor to simulate a current caused by the flow of positive ions into the substrate.

Figure 7A:
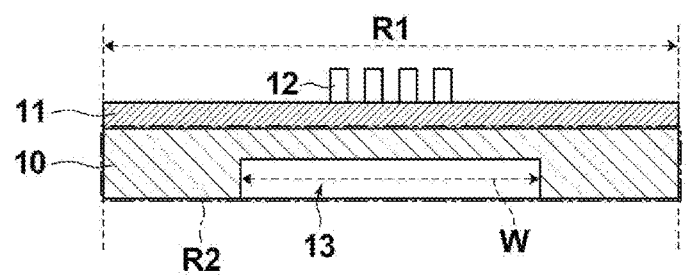
FIG. 7A is a schematic sectional view showing the state of a protective film prior to etching.
Figure 7B:
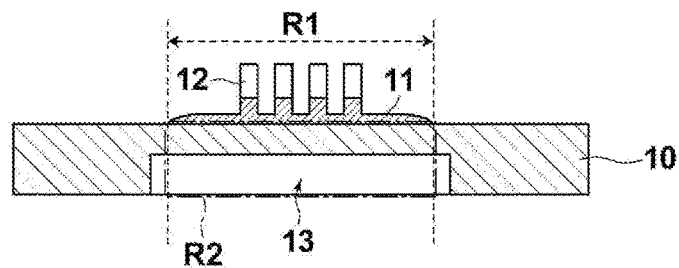
FIG. 7B is a schematic sectional view showing a state in which a protective film range is reduced by etching.

However, in the case that a substrate 10 having a recess on the back surface thereof is employed, the range of the substrate portion which functions as a dielectric will change as a protective film 11 is etched over time, and the relative dielectric constant of the capacitor C will also change. In greater detail, the following occurs. FIG. 7A is a schematic sectional view showing the state of a protective film 11 before etching, and FIG. 7B is a schematic sectional view showing the state in which the range of a protective film 11 is reduced by etching.

Etching of the protective film 11 progresses at a faster rate at the outer edge portion than at the central portion of the protective film 11, due to the influence of etching from the horizontal direction. Therefore, the coating area of the protective film 11 is gradually reduced from the outer edge toward the central portion, as shown in FIGS. 7A and 7B. Accordingly, the surface area of the substrate 10 at which electrical potential is equal is different in the case that a covered region R1 at which the protective film 11 is present on the surface of the substrate is greater than the range of the recess 13 that exists on the back surface (FIG. 7A) and the case that the covered region R1 is smaller than the range of the recess 13 (FIG. 7B). Thereby, a corresponding region R2 (a region of the portion of substrate that contributes to etching of the protective film 11 as a capacitor related to the surface electrical potential Vs) of the substrate corresponding to the covered region R1 will also be different. In other words, due to the coated region R1 being reduced, the average dielectric constant $\varepsilon_2$ of the corresponding region R2 in the case of FIG. 7B will be less than the average dielectric constant $\varepsilon_1$ of the corresponding region R2 in the case of FIG. 7A as etching progresses ($\varepsilon_2 < \varepsilon_1$). This is because the percentage of volume occupied by the recess 13 (vacuum) having a lower dielectric constant than the material of the substrate will increase within the volume of the corresponding region R2 increases as etching progresses. As a result, even if the intensity of the bias voltage applied to the substrate 10 is constant during etching, the surface electrical potential Vs of the protective film 11 increases because the dielectric constant of the corresponding region R2 becomes smaller.

Figure 8:
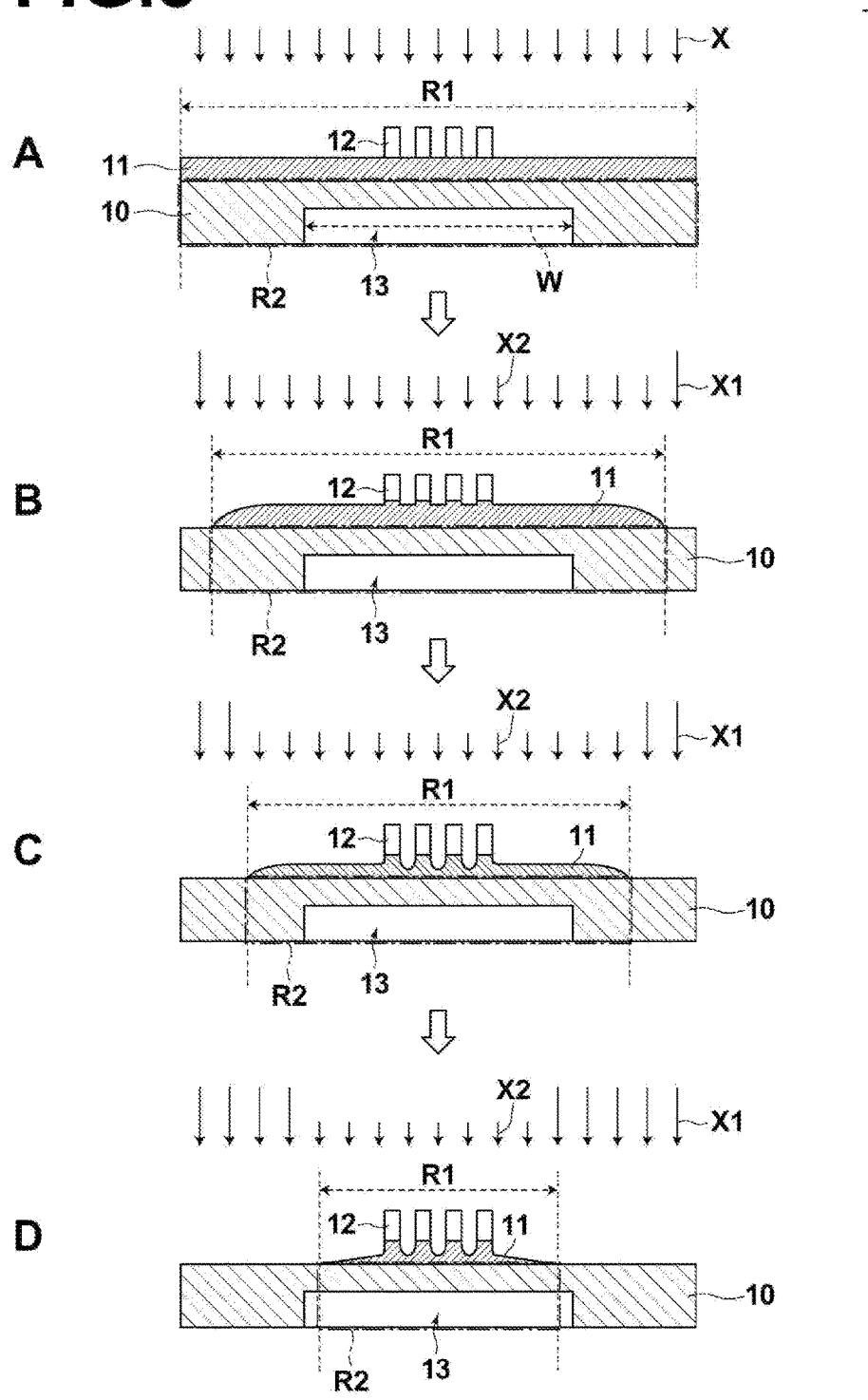
FIG. 8 is a collection of schematic cross sectional diagrams showing the steps of a conventional method for etching a protective film formed on a substrate with a recess on the back surface thereof.

FIG. 8 is a collection of schematic cross sectional diagrams showing the steps of a conventional method for etching a protective film formed on a substrate 10 with a recess on the back surface thereof. As mentioned above, that the surface electrical potential Vs of the protective film 11 increases during etching means that the kinetic energy of positive ions X2 entering the protective film 11 will decrease compared to the kinetic energy of the positive ions X2 at the beginning of etching. In other words, as shown in FIG. 8, the kinetic energy of the positive ions X2 continues to decrease over a period of time (A through C of FIG. 8) during which the percentage of the recess 13 that occupies the corresponding region R2 increases, and will be constant during a period of time (D in FIG. 8) during which the percentage of the recess 13 that occupies the corresponding region R2 does not change Note that with respect to positive ions X1 that enter the surface of the substrate after the protective film 11 has been removed, the dielectric constant is maintained constant, because transport of electrical charges will not occur in a region from which the protective film 11 has been removed, and therefore these regions will not necessarily have equal electrical potential.

As described above, the kinetic energy of the positive ions X2 continuously changing during etching is a problem in accurately forming fine patterns on a substrate. In addition, the kinetic energy of the positive ions X2 decreasing also results in anisotropic etching becoming difficult. Therefore, it is necessary to enable high quality patterns of protrusions and recesses to be formed even in cases that protective films formed on substrates having recesses on the back surfaces thereof are etched.

First Embodiment

A first embodiment of the present disclosure will be described.

FIG. 1 is a collection of schematic cross sectional diagrams showing the steps of a method for etching a protective film according to a first embodiment. In addition, FIG. 2A is a schematic plan view showing a state before reduction of a protective film during an etching process, and FIG. 2B is a schematic plan view showing a state after reduction of the protective film during the etching process. FIG. 2A illustrates the state of a protective film 11 corresponding to A of FIG. 1, and FIG. 2B illustrates the state of the protective film 11 corresponding to D of FIG. 1. FIG. 3 is a graph showing the manner of decrease of a dielectric constant and the manner of increase of a bias voltage in the first embodiment.

In the method for etching a protective film 11 of the present embodiment, a substrate 10 having a protective film 11 formed on a front surface and a recess 13 in a back surface opposite the front surface is prepared, a resist pattern 12 is formed on the protective film 11, and the protective film 11 is etched using plasma while applying a bias voltage using the resist pattern 12 as a mask, as illustrated in FIG. 1. In the present embodiment, the bias voltage is applied such that it increases according to the degree of decrease in dielectric constant during a period of time in which the dielectric constant is decreasing (A through C of FIG. 1), and maintained at a value corresponding to a constant dielectric constant during a period of time in which the dielectric constant is constant (D of FIG. 1) (FIG. 3). The method for producing a template of the present embodiment is that in which the substrate 10 is etched using the protective film 11, which is etched by the process described above, as a mask.

(Substrate)

The substrate 10 is a base for a template for nanoimprinting, for example, and has a recess formed in a surface (back surface) opposite the surface with a pattern formation region (region in which pattern of protrusions and recesses is to be formed). A material having optical transparency may be selected for the substrate 10 according to the intended use thereof. The material is not particularly limited and can be appropriately selected according to the intended use thereof, and examples of materials include quartz and resin. The substrate 10 is of a rectangular shape having a size of 65 mm×65 mm, 5 inches×5 inches, 6 inches×6 inches or 9 inches×9 inches, for example. The thickness is also selected as appropriate, taking the depth of the recess into consideration.

The shape of the recess may be circular, rectangular or polygonal. The depth of the recess is designed as appropriate, taking the degree of flexure (bending rigidity) and the gas permeability of the portion of the substrate which becomes thin due to recess processing. For example, a substrate having a size of 6 inches×6 inches and a thickness of 6.35 mm, having a circular recess with a diameter 63 mm and a depth of 5.25 mm (the thickness of the substrate is 1.1 mm at the recess portion) formed in center of the back surface may be utilized.

It is preferable for the substrate 10 to have a stepped structure (a so called mesa structure) on the surface thereof such that that the pattern formation region is on a base (mesa). The presence of the base limits the contact region between a template produced by processing the substrate 10 and a wafer to the surface of the base when executing nanoimprinting using the template. Therefore, structures (alignment marks, for example) which are present on the substrate other than the base can be prevented from contacting the wafer. The height of the pedestal is preferably within a range from 1 µm to 1000 µm, more preferably a range from 10 µm to 500 µm, and even more preferably a range from 20 µm to 100 µm.

(Protective Film)

The protective film 11 functions as a hard mask layer, for example. The material of the protective film 11 is selected such that the etching selectivity of the protective film with respect to resist becomes greater and such that the etching selectivity of the protective film with respect to the subject becomes smaller. It is preferable for the material of the protective film 11 to be a metal material such as Cr, W, Ti, Ni, Ag, Pt and Au, metal oxide materials such as $CrO_x$, $WO_2$ and $TiO_2$, or composites thereof. It is particularly preferable for the protective film 11 to contain Cr. Taking the etching selectivity of the protective film 11 with respect to the substrate 10 into consideration, it is preferable for the percentage of a metal material within the constituent material of the protective film 11 to be 40% or greater, more preferably 60% or greater, and even more preferably 80% or greater. If the ratio of the metal material is too small, the etching selectivity of the protective film 11 with respect to the substrate 10 will increase. In addition, it is preferable for the protective film 11 to have a multilayer structure having at least one layer containing chromium (Cr).

The protective film 11 may be formed by a vapor film forming method such as sputtering, chemical vapor deposition, molecular beam epitaxy, and ion beam sputtering. Then, the transmittance of the protective film 11 with respect to light having a wavelength of 365 nm is preferably 30% or greater, more preferably 50% or greater, and even more preferably 70% or greater. This is because it will be possible to irradiate the light through the substrate 10 when forming a resist pattern on the protective film 11 by a nanoimprinting method of the photocurable type. The thickness of the protective film 11 suitably selected taking the aimed processing depth, the aforementioned etching selectivity, and permeability of a substrate to be ultimately obtained, and may be within a range from 1 nm to 30 nm, for example.

(Resist Pattern)

The resist pattern 12 is formed by patterning method such as the nanoimprinting method, the photolithography method, and the electron beam lithography method. For example, it is possible to form a resist pattern in the following manner using the nanoimprinting method.

The resist material is not particularly limited, and a material prepared by adding a photopolymerization initiator (approximately 2% by mass) and a fluorine monomer (0.1% by mass to 1% by mass) to a polymerizable compound may be employed. It is also possible to add an antioxidant agent (approximately 1% by mass), if necessary. The material produced by the above procedure is cured by ultraviolet light having a wavelength of approximately 360 nm. In the case that the material has poor solubility, it is preferable for the material to be dissolved by adding a small amount of acetone or ethyl acetate, and then for the solvent to be distilled off. Examples of the polymerizable compound include benzyl acrylate (Viscoat #160: produced by Osaka Organic Chemical Co., Ltd.), ethyl carbitol acrylate (Viscoat #190: produced by Osaka Organic Chemical Co., Ltd.), polypropylene glycol diacrylate (Aronix M-220: produced by Toagosei Co., Ltd.), trimethylolpropane PO-modified triacrylate (ARONIX M-310: produced by Toagosei Co., Ltd.), and Compound A represented by Structural Formula (1) below. Further, examples of the polymerization initiator include alkyl phenone photopolymerization initiators such as 2-(di-methylamino)-2-[(4-methylphenyl)methyl]-1-[4-(4-morpholinyl)phenyl]-1-butanone (IRGACURE 379: produced by BASF Co., Ltd.) and the like. Examples of the above fluorine monomer include Compound B represented by Structural Formula (2) below. Here, the viscosity of the material is within a range from 8 cP to 20 cP for example, and the surface energy of the resist material is within a range from 25 mN/m to 35 mN/m, for example.

[Structural Formula 1]

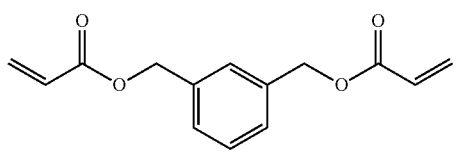

[Structural Formula 2]

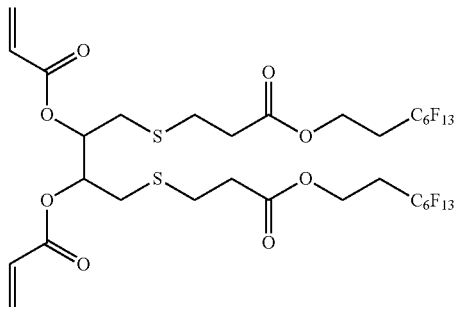

As the method for coating the resist, it is preferable to use a method in which a predetermined quantity of liquid droplets can be placed at predetermined positions on the substrate, such as the ink jet method and the dispensing method. However, it is possible to use a method capable of applying a resist with a uniform thickness such as the spin coating method or the dip coating method. In the case that the spin coating method or the dip coating method is employed, the resist is diluted with a solvent to be a predetermined thickness. A uniform coated film is formed on the substrate by controlling the rotational speed in the case of spin coating, and by controlling the draw up speed in the case of the dip coating method.

After the resist is coated on the substrate 10, a mold having a predetermined pattern is caused to contact the resist. It is preferable for residual gas in the atmosphere between the mold and the substrate to be reduced by reducing the pressure or by causing the atmosphere to be a vacuum prior to the mold being placed in contact with the resist, However, there is a possibility that the resist will volatilize before curing in a high vacuum atmosphere, and it may be difficult to maintain a uniform film thickness. Therefore, it is preferable for the residual gas in the atmosphere between the mold and the substrate to be reduced by causing this atmosphere to be a He atmosphere or a reduced-pressure He atmosphere. Because He passes through quartz substrates, captured residual gas (He) will gradually be reduced. A reduced pressure He atmosphere is more preferable, because the passage of He through quartz is time consuming. It is preferable for the pressure in the reduced pressure atmosphere to be within a range from 1 kPa to 90 kPa, and particularly preferably within a range from 1 kPa to 10 kPa. After the resist pattern 12 is formed, the mold is peeled off from the resist pattern 12.

(Etching of the Protective Film)

Etching of the protective film 11 is a process of etching the protective film 11 underlying the resist pattern 12, using the resist pattern 12 as a mask. Etching is performed by reactive ion etching using a plasma (RIE). It is preferable for etching to be executed by inductively coupled plasma (ICP)-RIE, capacitively coupled plasma (CCP)-RIE or electron cyclotron resonance (ECR)-RIE. Further, it is preferable for a control method that controls the bias power in the present disclosure (electrical power for forming a bias voltage between the plasma and the lower electrode) independent of plasma power (electrical power for forming plasma), in order to facilitate control. The etching conditions for etching the protective film 11 are selected such that the etching selectivity of the protective film 11 with respect to the resist is great. This is because the resist mask partially disappears if the selectivity is small, and there is a possibility that break defects (disconnection) will occur.

At least a bias voltage is applied in this process. This is because etching does not proceed anisotropically unless a bias voltage is applied, and an excessive amount of time will be necessary to etch the protective film 11. In such a case, the resist mask will disappear due to etching for an excessive amount of time, and break defects will occur. Even if etching is accomplished without break defects being generated, a significant CD (critical dimension) shift or CD increase cannot be avoided.

Further, in the present disclosure, in order to solve the problem mentioned above, that is, the problem that occurs in the case that a protective film 11 formed on a substrate 10 having a recess 13 on the back surface thereof is etched, the bias power is increased according to the manner of decrease in the dielectric constant of the corresponding region R2 of the substrate corresponding to the covered region R1. Note that the term "increased" means that the bias voltage is ultimately increased during the etching process from the initiation to the completion of etching, and the manner of increase during the etching process is not limited. For example, the bias voltage may be continuously increased, increased in a stepwise manner, or may be increased by a combination of these two manners. It is also possible to decrease the bias voltage as necessary during a portion of the etching process.

The present embodiment adopts a method for increasing the bias voltage according to the degree of decrease of the dielectric constant while the dielectric constant is decreased, as a method of increasing the bias voltage (FIG. 3). In other words, while the dielectric constant is decreasing, the bias voltage is increased in order to offset the increase in the surface electrical potential Vs caused by the decrease, that is, the bias voltage is increased according to the degree of decrease in the dielectric constant. Specifically, the method is as follows. The percentage of the recess 13 within the corresponding region R2 increases (A through C of FIG. 1) from a time $t_1$ (a time when etching is initiated) to a time $t_2$ (a time when the range of the covered region R1 substantially matches the range of the recess 13), and therefore the dielectric constant ε decreases from $ε_1$ to $ε_2$. During this time, the bias voltage Vb is gradually increased from $V_1$ to $V_2$ so as to offset the increase in the surface electrical potential Vs caused by the decrease in the dielectric constant in the present embodiment. From the time $t_2$ to a time $t_3$ (a time when etching is completed), the percentage of the recess 13 within the corresponding region R2 does not change (D in FIG. 1), and therefore, the decrease of the dielectric constant ε stops. During this period, the increase in the bias voltage Vb is stopped, and the bias voltage Vb is maintained at $V_2$ in the present embodiment.

As a result, the surface electrical potential Vs of the corresponding region R2 is maintained constant during the etching process, and the kinetic energy of the positive ions X2 is also maintained constant. The protective film 11 can be accurately processed while maintaining a constant etching environment from the initiation to completion of etching.

Note that FIG. 3 illustrates a case in which the specific dielectric constant decreases linearly over time as an example. However, the manner in which the dielectric constant decreases is not limited to that in which the decrease is linear over time as in the above example.

It is preferable for a mixed gas of $Cl_2$ and $O_2$ to be utilized as an etching gas if the protective film 11 is formed by Cr, and for a mixed gas of $Cl_2$ and $BCl_3$ to be utilized as an etching gas if the protective film is formed by Ta.

The range of the covered region R1 during etching may be detected, and the manner of decrease of the dielectric constant may be determined by the manner of change in the percentage of the corresponding region R2 of the substrate 10 corresponding to the covered region R1 in which the recess 13 is present, for example. Laser beams may be irradiated onto sites on the surface of the substrate 10 during the etching of the protective film 11, and the range of the covered region R1 can be detected by detecting the reflected light, for example. Since the position and size of the recess 13 in the substrate 10 are known, the percentage of the corresponding region R2 occupied by the recess 13 can be calculated by detecting the range of the coated region R1 and specifying the position and size thereof. This percentage may be calculated from the ratio of the volume of the recess 13 with respect to the volume of the corresponding region R2, for example. Alternatively, if the depth of the recess 13 is constant, the percentage may be calculated by converting a one dimensional ratio of the width W of the recess 13 with respect to the width of the corresponding region R2 to a two dimensional ratio that also includes depth.

In addition, plasma components may be measured by plasma emission spectroscopy during etching, and the manner of decrease in dielectric constant may be determined by the manner of change in the amount of a component correlated with etching of the protective film 11 from among the measured components, for example. A component which is correlated with the etching of the protective film 11 is, for example, a plasma component generated by the material of the protective film 11. By measuring the content or content ratio of such a component in the plasma components, it will be possible to understand to what degree the protective film 11 has been etched, and it will also be possible to understand the degree of reduction of the coated region R1. If the degree of reduction of the covered region R1 is known, the percentage of the corresponding region R2 that corresponds to the covered region R1 occupied by the recess 13 may be calculated in the same manner as that described above.

In addition, with respect to the manner of decrease in dielectric constant, a manner of increase in bias voltage (a bias voltage control profile such as that illustrated in FIG. 3) may be determined in advance based on the relationship between etching time and the manner of decrease in dielectric constant during etching. In this case, the bias voltage may be increased according to the determined manner of increase in bias voltage.

(Etching of the Substrate)

Etching of the substrate 10 is a process that etches the substrate 10 after a pattern is formed in the protective film 11, using the protective film 11 as a mask. Thereby, a desired pattern of protrusions and recesses is formed in the substrate 10. The substrate, in which the pattern of protrusions and recesses is formed, is a template. Etching is executed by reactive ion etching (RIE) in the same manner as the etching of the aforementioned protective film 11, for example. It is particularly preferable for etching to be executed by ICP-RIE, CCP-RIE, or ECR-RIE. Further, it is preferable for a control method that controls the bias power in the present disclosure independent of plasma power, in order to facilitate control.

As described above, the present embodiment increases the bias voltage according to the manner of decrease in the dielectric constant of the corresponding region of the substrate corresponding to the covered region of the surface of the substrate at which the protective film is present. Therefore, changes in bias voltage at local regions of the surface of the substrate at which patterns of protrusions and recesses are formed can be predicted appropriately and corrected for. As a result, it becomes possible to form a high quality pattern of protrusions and recesses on a protective film formed on a substrate having a recess on the back surface thereof.

The method of producing a template of the present embodiment utilizes the method for etching a protective film described above. Therefore, it becomes possible to form a high quality pattern of protrusions and recesses on a protective film formed on a substrate having a recess on the back surface thereof.

In addition, the template of the present embodiment is produced by the above method for producing a template. Therefore, the template has a high quality pattern of protrusions and recesses.

Second Embodiment

Next, a second embodiment of the present disclosure will be described. The present embodiment differs from the first embodiment in the point that a "method in which the bias voltage is set to zero during a period of time in which the dielectric constant is decreasing, and increased to and maintained at a value corresponding to a constant value of the dielectric constant during a period of time in which the dielectric constant becomes the constant value" is adopted. Therefore, detailed description of constituent elements which are the same as those of the first embodiment will be omitted unless particularly necessary.

Figure 4:
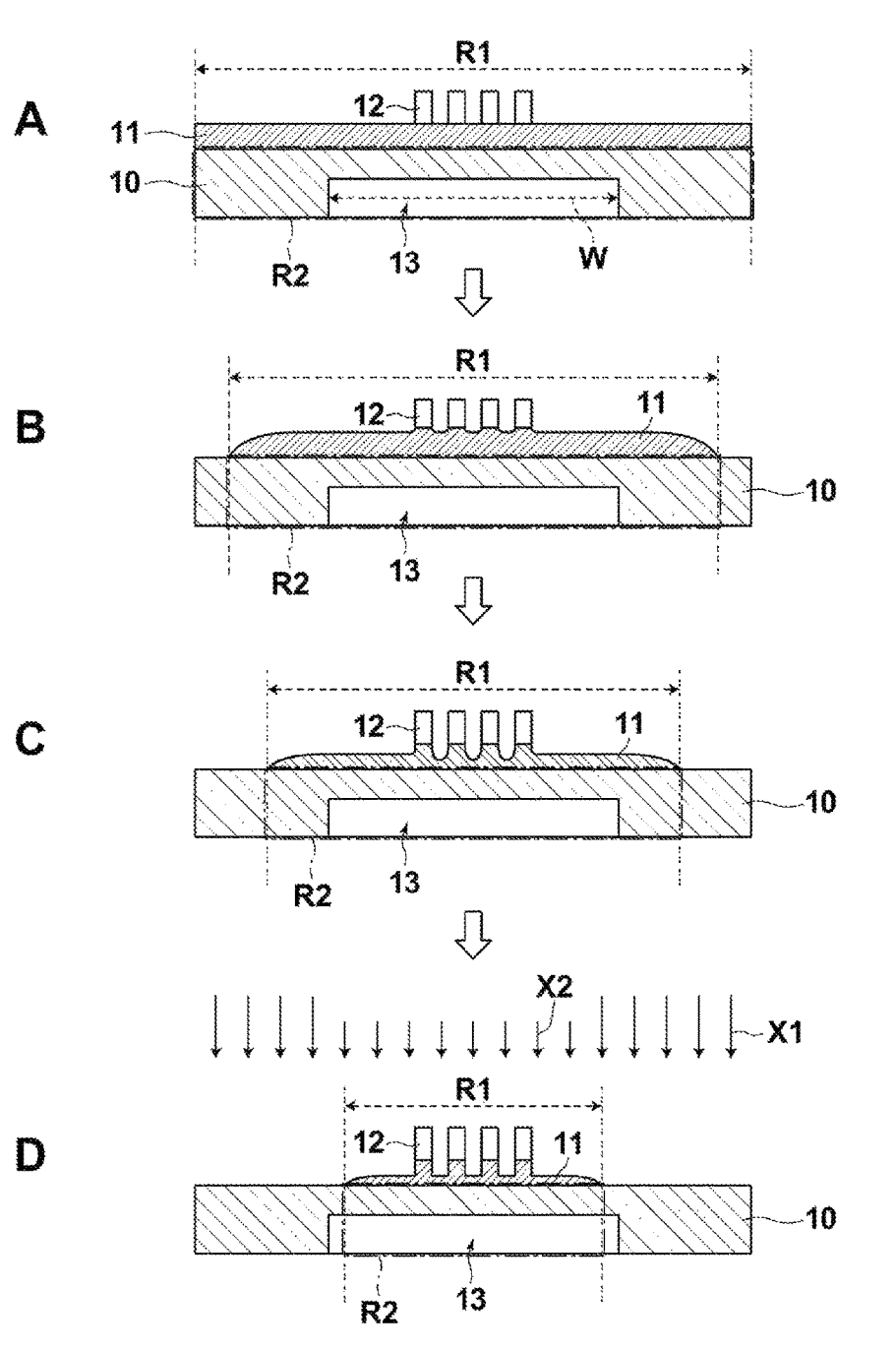
FIG. 4 is a collection of schematic cross sectional diagrams showing the steps of a method for etching a protective film according to a second embodiment.
Figure 5:
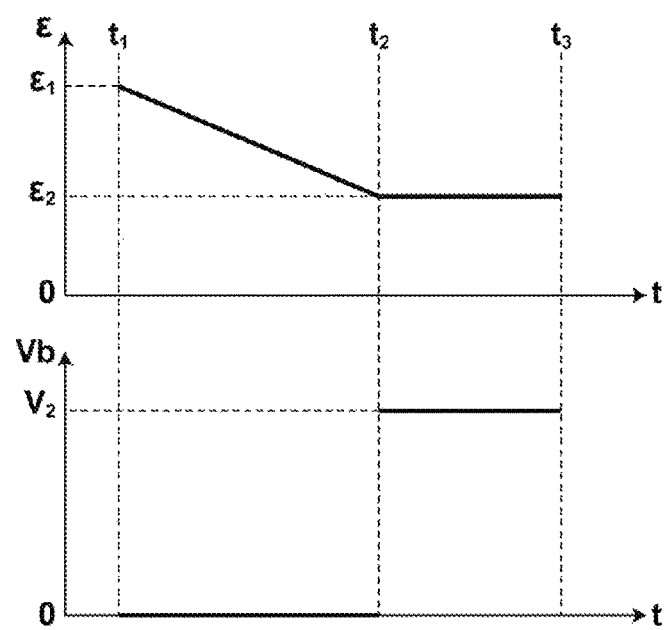
FIG. 5 is a graph showing the manner of decrease of a dielectric constant and the manner of increase of a bias voltage in the second embodiment.

FIG. 4 is a collection of schematic cross sectional diagrams showing the steps of a method for etching a protective film according to the second embodiment. FIG. 5 is a graph showing the manner of decrease of a dielectric constant and the manner of increase of a bias voltage in the second embodiment.

In the method for etching a protective film 11 of the present embodiment, a substrate 10 having a protective film 11 formed on a front surface and a recess 13 in a back surface opposite the front surface is prepared, a resist pattern 12 is formed on the protective film 11, and the protective film 11 is etched using plasma while applying a bias voltage using the resist pattern 12 as a mask, as illustrated in FIG. 4. In the present embodiment, the bias voltage is applied such that it is set to zero during a period of time in which the dielectric constant is decreasing (A through C of FIG. 4), and increased to and maintained at a value corresponding to a constant dielectric constant during a period of time in which the dielectric constant is constant (D of FIG. 4) (FIG. 5).

(Etching of Protective Film)

The present embodiment adopts a method in which a bias voltage is not applied during a period of time in which the dielectric constant is decreasing, the bias voltage is increased to a value corresponding to the value of the dielectric constant when the decrease stops, and the bias voltage is maintained at this value (FIG. 5). An ion sheath remains even if the bias voltage is zero, and therefore positive ions enter the protective film 11. However, in the present embodiment, the dependency of the surface electrical potential Vs on time becomes extremely small even when the coated region R1 is reduced, because the bias voltage is zero. In addition, in the present embodiment, the dielectric constant of the corresponding region R2 does not change due to the reduction in the covered region during the period of time in which the bias voltage is being applied, and the kinetic energy of the positive ions X2 that enter the protective film 11 also does not change. In this case, a bias voltage is not applied during a period of time from time $t_1$ to time $t_2$, and isotropic etching is executed as a result. However, anisotropic etching is executed during a period of time from time $t_2$ to time $t_3$. That is, the method of the present embodiment is effective in the case that it is desired to simplify a control profile or to shorten the period of time during which a bias voltage is applied as much as possible, because the control profile of a bias voltage will become complex if a bias voltage is applied while the dielectric constant is decreasing. There is also an advantage that break defects will become unlikely to occur if the amount of time during which a bias voltage is applied is shortened.

As a result, the surface electrical potential Vs of the corresponding region R2 is maintained constant during the etching process, and the kinetic energy of the positive ions X2 is also maintained constant. The protective film 11 can be accurately processed while setting the etching environment in two steps, which is easily controlled, from the initiation to completion of etching.

As described above, in the present embodiment as well, the bias voltage is increased according to the manner of decrease in the dielectric constant of the corresponding region of the substrate corresponding to the covered region of the surface of the substrate at which the protective film is present. Therefore, the same advantageous effects as those obtained by the first embodiment are obtained.

EXAMPLES

Examples of the present disclosure are shown below.

Example 1

(Production of Mold)

A resist solution having a PHS (polyhydroxy styrene) series chemically amplified resist as a main component was coated on a Si substrate by the spin coating method to form a resist layer. Then, an electron beam was irradiated while scanning the Si substrate on a XY stage, and the entire surface of the resist layer having a range of 20×30 mm was exposed. Then, the resist layer was developed, the exposed portions were removed, and the pattern of the resist layer was employed as a mask to perform selective etching by RIE such that the depth of grooves was 100 nm by RIE, to obtain a Si mold. The taper angle of the pattern was 85 degrees. A mold release process was administered on the surface of the mold by a dip coating process with OPTOOL DSX. The pattern at the center of the Si substrate has a 10 mm square transfer surface region, and a pattern of protrusions and recesses is a line pattern having a length of 10 mm, a width of 28 nm, and grooves having a pitch 56 nm and a depth of 60 nm.

(Substrate for Nanoimprinting)

A 152 mm square quartz substrate having a thickness of 6.35 mm was utilized as a nanoimprinting substrate. A 26×32 mm rectangular base having a height of 30 μm is formed on a transfer region at the center of the quartz substrate by wet etching. Further, a recess having a diameter 64 mm and a depth of 5 mm is formed in the center of the back surface of the substrate. A 4 nm thick chromium film was formed on the surface of the substrate by the sputtering method to form a hard mask layer.

Thereafter, the substrate underwent a surface treatment with a silane coupling agent KBM-5103 (produced by Shin Etsu Chemical Co., Ltd.), which has superior adhesive properties with resist. KBM-5103 was diluted to 1% by mass with PGMEA, then coated on the surface of the substrate by the spin coating method. Next, the coated substrate was annealed on a hot plate at 150° C. for 5 minutes, to bind the silane coupling agent to the surface of the substrate.
(Nanoimprinting Process)

A resist including 48% by mass of Compound A described above, 48% by mass of Aronix M220, 3% of IRGACURE 379 and 1% by mass of compound B was prepared. Next, the photocurable resist was coated on the chromium film of the quartz substrate. DMP-2838, which is a piezo type ink jet printer produced by FUJIFILM Dimatix, Inc., was utilized to coat the resist. DMC-11610, which is a dedicated 10 pl head, was utilized as the ink jet head. Droplet discharge conditions were set and adjusted in advance such that the amount in each droplet was 10 pl. The droplet arrangement pattern was a lattice pattern with a pitch of 450 µm. Droplets were arranged on the transfer region (the base on the substrate) according to the droplet arrangement pattern.

The mold and the quartz substrate were caused to approach each other to a position at which a gap therebetween is 0.1 mm or less, and the two were aligned from the back surface of the quartz substrate such that alignment marks on the substrate and alignment marks on the mold were aligned. The space between the mold and the quartz substrate was replaced with 99% or greater by volume of He gas, and pressure was reduced to 50 kPa or lower after the replacement with He. The mold was caused to contact the droplets of resist under reduced pressure He conditions. After contact, 1 Mpa of pressure was applied for 5 seconds, and exposure was performed with ultraviolet light having a wavelength of 365 nm at an irradiation intensity of 300 mJ/cm$^2$ to cure the resist. Thereafter, the mold and the substrate were separated.
(Etching of Hard Mask Layer)

An inductively coupled plasma (ICP) reactive ion etching apparatus was employed to etch the hard mask with the etching conditions shown below.

| Gas species | chlorine:oxygen = 3:1 |
|---|---|
| Process pressure | 5 Pa |
| ICP power (plasma power) | 100 W |
| Over etching amount | 50% |

Regarding the bias power, the bias power was increased from 5 W at a constant rate accompanying the passage of time from initiation of etching, based on the etching time and the area of the covered region of the hard mask layer, which was measured in advance. At a point in time at which the covered region of the hard mask layer was approximately the same as the range of the recess in the substrate, the bias power was adjusted to be 40 W, and etching was performed while maintaining the bias power at 40 W from this point in time.

The endpoint of the execution time of the etching process was designated as a point in time which is 50% more than the time elapsed until at least the hard mask layer was removed. That is, the etching process was executed with a point in time at which the over etching amount became 50% of the average thickness of the hard mask layer as a guide.
(Etching of Substrate)

The quartz substrate was etched with the hard mask layer as a mask aiming for a depth of 60 nm under the following conditions.

| Gas species | CHF$_3$:argon = 1:10 |
|---|---|
| Process pressure | 1 Pa |
| ICP power | 100 W |
| Bias power | 100 W |

(Evaluation of Pattern)

Thereafter, the shape of the pattern was evaluated by a scanning electron microscope.
Evaluation Item 1

The pattern was evaluated as "GOOD" if there were no break defects, and evaluated as "POOR" if break defects were present.
Evaluation Item 2

With respect to CD shift, an amount of deviation from a line width of 28 nm was evaluated. A case in which the deviation was within a range of 28±3 nm was evaluated as "GOOD", and a case in which the deviation was outside this range was evaluated as "POOR".

Example 2

Example 2 is the same as Example 1 except that the etching process of the hard mask layer was executed in the following manner. Specifically, in Example 2, an inductively coupled plasma (ICP) reactive ion etching apparatus was employed to etch the hard mask with the etching conditions shown below.

| Gas species | chlorine:oxygen = 3:1 |
|---|---|
| Process pressure | 5 Pa |
| ICP power | 100 W |
| Over etching amount | 50% |

Regarding the bias power, the bias power was maintained at zero for a certain amount of time from initiation of etching, based on the etching time and the area of the covered region of the hard mask layer, which was measured in advance. At a point in time at which the covered region of the hard mask layer was approximately the same as the range of the recess in the substrate, the bias power was adjusted to be 40 W, and etching was performed while maintaining the bias power at 40 W from this point in time.

Comparative Example 1

Comparative Example 1 is the same as Example 1 except that the etching process of the hard mask layer was executed in the following manner. Specifically, in Comparative Example 1, an inductively coupled plasma (ICP) reactive ion etching apparatus was employed to etch the hard mask with the etching conditions shown below.

| Gas species | chlorine:oxygen = 3:1 |
|---|---|
| Process pressure | 5 Pa |
| ICP power | 100 W |
| Bias power | 40 W |
| Over etching amount | 50% |

Comparative Example 2

Comparative Example 2 is the same as Example 1 except that the etching process of the hard mask layer was executed in the following manner. Specifically, in Comparative Example 2, an inductively coupled plasma (ICP) reactive ion etching apparatus was employed to etch the hard mask with the etching conditions shown below.

| | |
|---|---|
| Gas species | chlorine:oxygen = 3:1 |
| Process pressure | 5 Pa |
| ICP power | 100 W |
| Bias power | 0 W |
| Over etching amount | 50% |

Comparative Example 3

Comparative Example 3 is the same as Example 1 except that the etching process of the hard mask layer was executed in the following manner. Specifically, in Comparative Example 3, an inductively coupled plasma (ICP) reactive ion etching apparatus was employed to etch the hard mask with the etching conditions shown below.

| | |
|---|---|
| Gas species | chlorine:oxygen = 3:1 |
| Process pressure | 5 Pa |
| ICP power | 100 W |
| Bias power | 0 W |
| Over etching amount | 200% |

<Evaluation>

Table 1 shows the evaluation results for Examples 1 and 2 as well as for Comparative Examples 1 through 3. None of Comparative Examples 1 through 3 exhibited evaluations equivalent to those of Examples 1 and 2, and the superiority of the present disclosure was demonstrated.

TABLE 1

| | BREAK DEFECTS | CD SHIFT |
|---|---|---|
| Example 1 | GOOD | GOOD |
| Example 2 | GOOD | GOOD |
| Comparative Example 1 | POOR | GOOD |
| Comparative Example 2 | GOOD | POOR |
| Comparative Example 3 | POOR | GOOD |

What is claimed is:

1. A method for etching a protective film, comprising the steps of:
preparing a substrate having a protective film formed on a front surface and a recess in a back surface opposite the front surface;
forming a resist pattern on the protective film; and
etching the protective film using plasma while applying a bias voltage, using the resist pattern as a mask;
the bias voltage being increased according to the manner of decrease in the dielectric constant of a region of the substrate corresponding to a covered region of the front surface at which the protective film is present in the protective film etching step, resulting from an increase in a percentage of a volume occupied by the recess within a volume of the region of the substrate.

2. A method for etching a protective film as defined in claim 1, wherein:
the bias voltage is increased according to a degree of decrease in the dielectric constant while the dielectric constant is decreasing, and the bias voltage is maintained at a value corresponding to a constant value while the dielectric constant is at the constant value.

3. A method for etching a protective film as defined in claim 1, wherein:
the bias voltage is zero while the dielectric constant is decreasing, then increased to and maintained at a value corresponding to a constant value while the dielectric constant is at the constant value.

4. A method for etching a protective film as defined in claim 1, wherein:
a dimension of the covered region is detected during etching; and
the manner of decrease in the dielectric constant is determined based on the manner of change in the percentage of the recess within the dimension of the substrate corresponding to the covered region.

5. A method for etching a protective film as defined in claim 1, wherein:
plasma components are measured by plasma emission spectroscopy during etching; and
the manner of decrease of the dielectric constant is determined based on the manner of change in the amount of a component which is correlated with etching of the protective film from among the measured components.

6. A method for etching a protective film as defined in claim 1, wherein:
the manner of increase of the bias voltage is determined in advance based on the relationship between etching time and the manner of decrease of the dielectric constant during etching; and
the bias voltage is increased according to the determined manner of increase of the bias voltage.

7. A method for etching a protective film as defined in claim 1, wherein:
the percentage of metal materials within a constituent material of the protective film is 40% or greater.

8. A method for etching a protective film as defined in claim 1, wherein:
the transmittance of the protective film with respect to light having a wavelength of 365 nm is 30% or greater.

9. A method for producing a mold, comprising:
etching a protective film formed on a substrate having a recess on the back surface thereof by a method for etching a protective film as defined in claim 1; and
etching the substrate using the etched protective film as a mask.

* * * * *